US007042079B2

(12) United States Patent
Gabara et al.

(10) Patent No.: US 7,042,079 B2
(45) Date of Patent: May 9, 2006

(54) VARIABLE ROTATIONAL ASSIGNMENT OF INTERCONNECT LEVELS IN INTEGRATED CIRCUIT FABRICATION

(75) Inventors: Thaddeus John Gabara, Murray Hill, NJ (US); Tarek Chaker Jomaa, Swindon (GB)

(73) Assignee: Lucent Technologies Inc., Murray Hill, NJ (US)

( * ) Notice: Subject to any disclaimer, the term of this patent is extended or adjusted under 35 U.S.C. 154(b) by 16 days.

(21) Appl. No.: 11/002,608

(22) Filed: Dec. 2, 2004

(65) Prior Publication Data

US 2005/0079654 A1    Apr. 14, 2005

Related U.S. Application Data

(62) Division of application No. 10/377,239, filed on Feb. 28, 2003, now Pat. No. 6,849,937, which is a division of application No. 09/703,184, filed on Oct. 31, 2000, now Pat. No. 6,586,281.

(51) Int. Cl.
| | |
|---|---|
| H01L 27/108 | (2006.01) |
| H01L 23/52 | (2006.01) |
| H01L 21/82 | (2006.01) |
| G06K 9/32 | (2006.01) |

(52) U.S. Cl. ............... 257/691; 257/296; 438/130; 438/128; 382/296; 382/298; 382/300

(58) Field of Classification Search ........... 257/691, 257/296; 438/130, 128; 382/296, 298, 300
See application file for complete search history.

*Primary Examiner*—Long Pham
*Assistant Examiner*—Shrinivas H. Rao

(57) ABSTRACT

Integrated circuit fabrication techniques are provided which allow non-horizontal/non-vertical wires to traverse the entire chip surface, rather than just the corners as in the conventional Manhattan geometry, while interconnecting circuit points. This is achieved by employing a variable rotational assignment methodology with respect to the interconnect layers or levels during the IC fabrication operation. These techniques thus eliminate the litho step problem, reduce interconnect distances and lessen the influence of capacitance interaction between interconnect wires.

5 Claims, 6 Drawing Sheets

FIG. 5
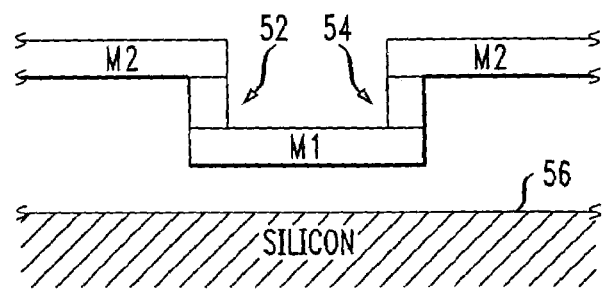
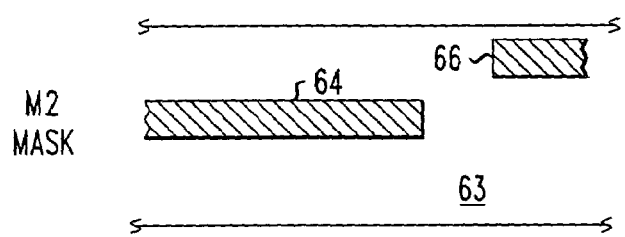
FIG. 6C
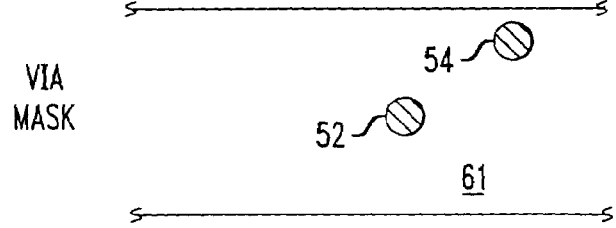
FIG. 6B
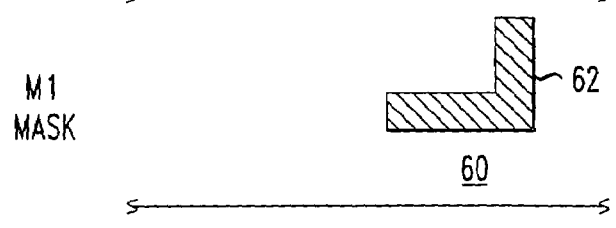
FIG. 6A

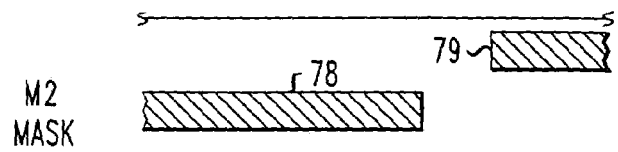
FIG. 7C
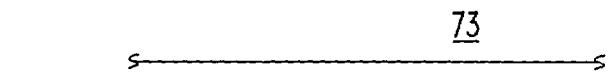
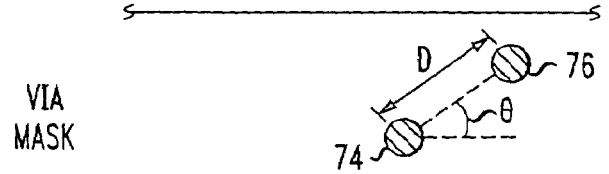
FIG. 7B
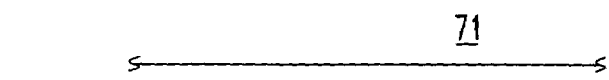
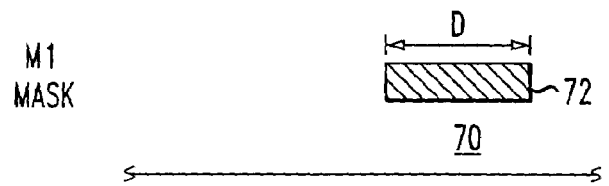
FIG. 7A
FIG. 8
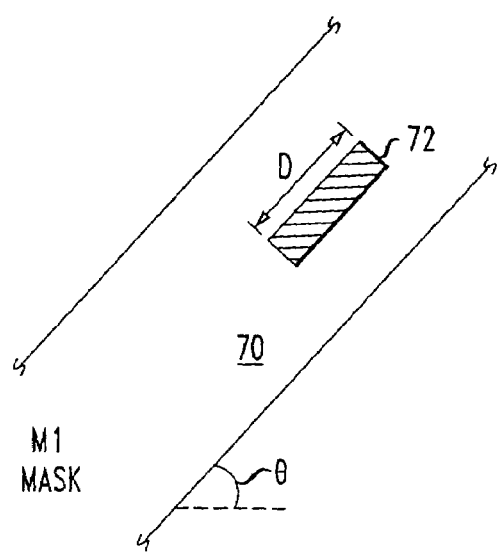

VARIABLE ROTATIONAL ASSIGNMENT OF INTERCONNECT LEVELS IN INTEGRATED CIRCUIT FABRICATION

CROSS-REFERENCE TO RELATED APPLICATION(S)

This application is a divisional application of U.S. patent application Ser. No. 10/377,239, filed Feb. 28, 2003 U.S. Pat. No. 6,849,937, which is a divisional application of U.S. patent application Ser. No. 09/703,184 filed Oct. 31, 2000, now issued as U.S. Pat. No. 6,586,281, the disclosures of which are incorporated by reference herein.

FIELD OF THE INVENTION

The invention relates to integrated circuit fabrication and, more particularly, to methods and apparatus for performing variable rotational assignment of interconnect levels for use in the fabrication of integrated circuits.

BACKGROUND OF THE INVENTION

It is known that conventional integrated circuit (IC) fabrication processes utilize a so-called "Manhattan geometry" to form the circuits and interconnects associated with an IC. In such a geometry, horizontal and vertical wires formed at 90° (degrees) to one another are used to connect points across the IC or chip, while a 45° wire is typically used in corners of the chip and, in some cases, in the internal section or interconnect, so that distances can be reduced. However, in order to implement these wires or edges in a Manhattan IC, one must adhere to the so-called "litho step." The litho step is defined as the resolution movement allowed in the x or y direction. For example, in 0.35 μm (micrometers), 0.25 μm and 0.18 μm wire sizes, the resolution step is 0.02 μm. Thus, to make a horizontal wire as shown in FIG. 1, a number of these litho steps are combined to form the horizontal wire. It is to be understood that W and L are multiples of the litho step. As shown in FIG. 1, a litho step includes the horizontal, or x, movement denoted by the arrow labeled A and the vertical, or y, movement denoted by the arrow labeled B.

However, when a 45° wire or edge is made using conventional Manhattan geometry techniques, the litho step causes the edges to become wavy, as illustrated in FIG. 2. This causes several problems. First, the database used to store the data associated with the fabrication of an IC that includes these edges increases significantly as compared to a database associated with the fabrication of only horizontal and vertical wires. The straight edges can be combined to reduce memory storage, but for 45° edges, the step of 0.02 μm in wires where W=0.3 μm and L=10,000 μm can be severe. Second, the extraction of this wire causes problems since the W and L are not well-defined, as illustrated by the waviness of the lines in FIG. 2. When this wire is a poly silicon gate, the extraction in a transistor causes most Computer Aided Design or CAD tools to give fictitious results, as well as increase the database size associated with the extraction. Third, the write time associated with 45° angles or lines is longer because of the grain size or "litho size" effect.

Thus, it would be advantageous to have a technique for forming a 45° edge that allows wires to crisscross the chip, i.e., to traverse the entire chip surface rather than just the corners as in the conventional Manhattan geometry, and therefore save on interconnect distances while avoiding the waviness problem associated with the litho step. For example, as shown in FIG. 3, assume that two points A and B in the chip must communicate with one another. Using conventional techniques, the Manhattan method would allow a horizontal wire along x and a vertical wire along y. This would give a total interconnect distance between A and B of x+y.

By drawing a wire along the hypotenuse, the interconnect distance is $\sqrt{x^2+y^2}$ which is less than x+y. In the case where x=y, the hypotenuse is $\sqrt{2x^2}$ while the distance between A and B in accordance with the conventional technique would be 2x. Thus, the distance is reduced by $$\frac{\sqrt{2}x}{2x} = \frac{1}{\sqrt{2}}$$

or 0.707. This is about 30% (percent) less distance than the distance associated with traversing only the edges of the triangle.

Unfortunately, several problems have prevented this technique from being previously realized. For example, the three problems described above are impediments to the use of such a technique. Further, once a wire runs from one corner of the chip to the other, as illustrated in FIG. 3 by wire AB, all interconnects on this level are blocked by the wire. Thus, interconnects on this level must be made in smaller Manhattan lengths or in 45° edges. But, as explained above, if this is done: (1) write time will increase enormously; (2) CAD extraction will be a problem; and (3) the data storage and file size will be large.

Accordingly, there is a need for IC fabrication techniques capable of forming a 45° wire, or a wire at another angle other than 0° or 90°, in an IC which overcome the problems described above such that wires so formed can crisscross the chip, and thus save on interconnect distances while avoiding the waviness problem associated with the litho step.

SUMMARY OF THE INVENTION

The present invention provides methods and apparatus for use in the fabrication of integrated circuits wherein non-horizontal and non-vertical wires or interconnect lines, i.e., non-0° and non-90° wires, respectively, are assigned to interconnect mask layers or levels separate from mask layers having horizontal and vertical wires assigned thereto. The assigned non-horizontal and non-vertical interconnect lines are then rotated to a horizontal and/or vertical orientation for printing the mask layers in which they are located. Assignment and rotation may take place within a CAD system. All mask layers may then be printed without the above-described litho step problem. Then, at the time of exposure of the appropriate metal layers of the integrated circuit, the masks associated with the non-horizontal and non-vertical wires are rotated so that the wires thereon are returned to their original non-horizontal and non-vertical orientation. The metal layers are then exposed. With the use of variable rotational assignment according to the invention and thus the elimination of the litho step problem, non-horizontal and non-vertical wires can traverse the entire chip surface, rather than just the corners as in the conventional Manhattan geometry, while interconnecting circuit points and saving on interconnect distances.

In one illustrative aspect of the invention, a method for use in fabricating at least a portion of an integrated circuit includes the following steps. First, one or more interconnect lines associated with the integrated circuit which are non-horizontal and non-vertical are assigned to at least one metal mask layer separate from at least another metal mask layer assigned to at least one of the horizontal interconnect lines and the vertical interconnect lines. Each of the one or more non-horizontal/non-vertical interconnect lines are then rotated from an original orientation by a predetermined angle determined by the original line orientation relative to the horizontal or vertical so that the one or more non-horizontal/non-vertical interconnect lines are horizontally and/or vertically oriented. It is to be appreciated that the above assigning and rotating operations may be performed by a computer system executing a CAD program.

Next, the one or more rotated non-horizontal/non-vertical interconnect lines are printed on the at least one metal mask layer assigned thereto. It is to be appreciated that the printing operation may be performed using a mask printing device such as an E-beam machine, as is known in the art.

Then, the at least one printed metal mask layer is rotated so that each of the one or more non-horizontal/non-vertical interconnect lines is returned to its original non-horizontal and non-vertical orientation. Lastly, the rotated metal mask layer is used to expose a corresponding metal layer of the integrated circuit. It is to be appreciated that the mask rotation and exposing operations may be performed in accordance with known IC fabrication equipment.

Of course, the interconnect lines which are originally intended to be horizontal and vertical and assigned to mask layers separate from the mask layers associated with the non-horizontal/non-vertical interconnect lines may be printed and used for exposure without rotation operations. Also, other non-horizontal/non-vertical features associated with the interconnect may be processed in accordance with the variable rotational assignment methodology described above. It is to be further appreciated that the scope of the present invention is also intended to encompass apparatus operative to implement the above-described methodology, as well as integrated circuits fabricated in accordance therewith.

Advantageously, the present invention eliminates various problems associated with conventional IC fabrication techniques and allows for interconnect distances to be reduced over, for example, a Manhattan interconnect by as much as 30%. Furthermore, the capacitance interaction of interconnects on lower and higher levels can be made less influential by using this invention, which from a noise coupling perspective is highly advantageous. Since the lower and upper layers are not parallel, the coupling capacitance to these interconnects will extend for only a fraction of the wire's length. Since this wire will be crossing other wires, the capacitive interaction of these other wires can cancel the capacitance of this wire, thus allowing lower noise due to this coupling effect.

Furthermore, as the number (N) of metalization or metal layers continues to increase, the rotation assignment to each layer can be $$\frac{360°}{N},$$

or as will be explained, $$\frac{180°}{N}.$$

This allows for finer granularity in the placement of the interconnect.

BRIEF DESCRIPTION OF THE DRAWINGS

FIG. 5 is a cross sectional view of an integrated circuit;

FIGS. 6A–6C are top views of masks used to fabricate an integrated circuit according to a conventional technique;

FIGS. 7A–7C are top views of masks used to fabricate an integrated circuit according to an embodiment of the present invention;

FIG. 8 is a top view illustrating the rotation of the M1 mask of FIG. 7A used to fabricate an integrated circuit according to an embodiment of the present invention.

DETAILED DESCRIPTION OF PREFERRED EMBODIMENTS

The present invention will be explained below in the context of an illustrative embodiment employing non-horizontal/non-vertical interconnect wires formed at angles of 45° and/or multiples thereof. However, it is to be understood that the present invention is not so limited. Rather, as will be explained below, the methodologies of the invention may be more generally applied in order to form non-horizontal/non-vertical interconnect wires at various other angles.

Figure 1:
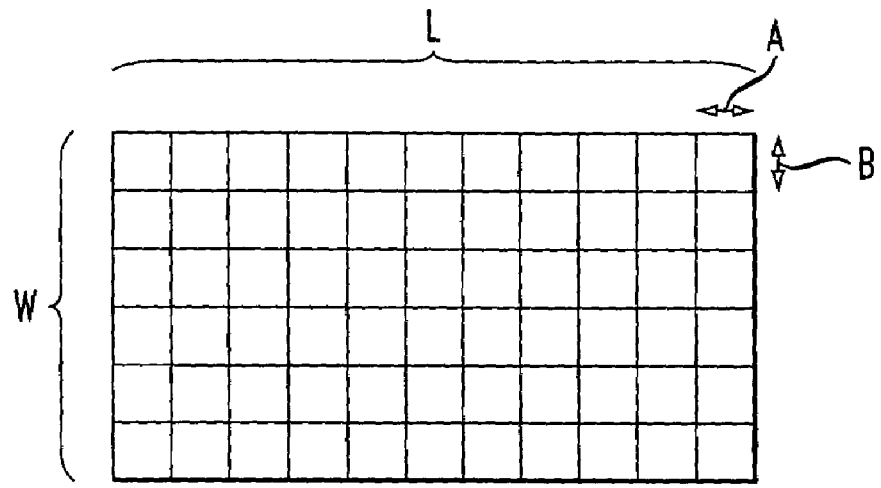
FIG. 1 is a diagram illustrating the litho step in the formation of a horizontal wire.
Figure 2:
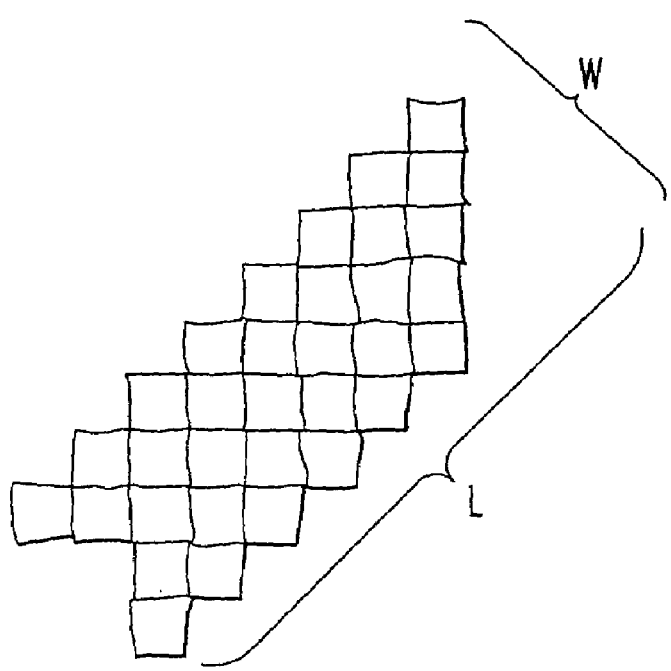
FIG. 2 is a diagram illustrating the effect of the litho step in the formation of a 45° wire.
Figure 3:
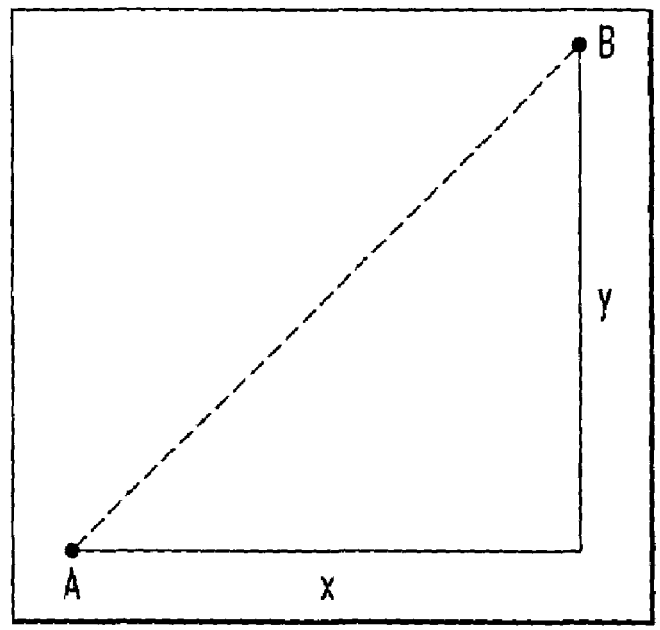
FIG. 3 is a diagram illustrating a desired 45° wire formation for saving interconnect distance between two points in an IC.
Figure 4A:
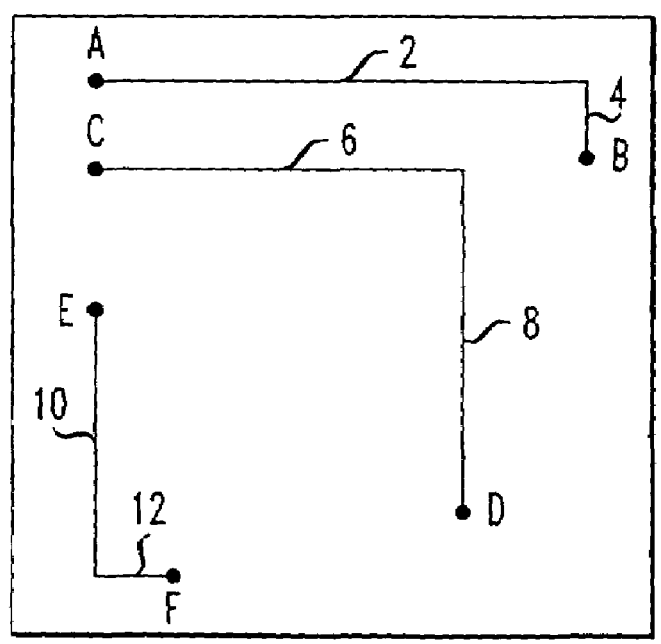
FIG. 4A is a diagram illustrating a conventional Manhattan layout.
Figure 4B:
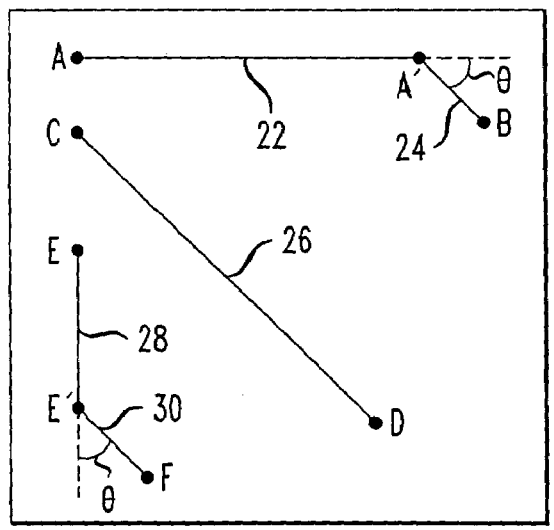
FIG. 4B is a diagram illustrating how the interconnect of FIG. 4A may be broken into a 0°/90° and 45° mask set in order to reduce interconnect distances in accordance with an embodiment of the present invention.
Figure 4C:
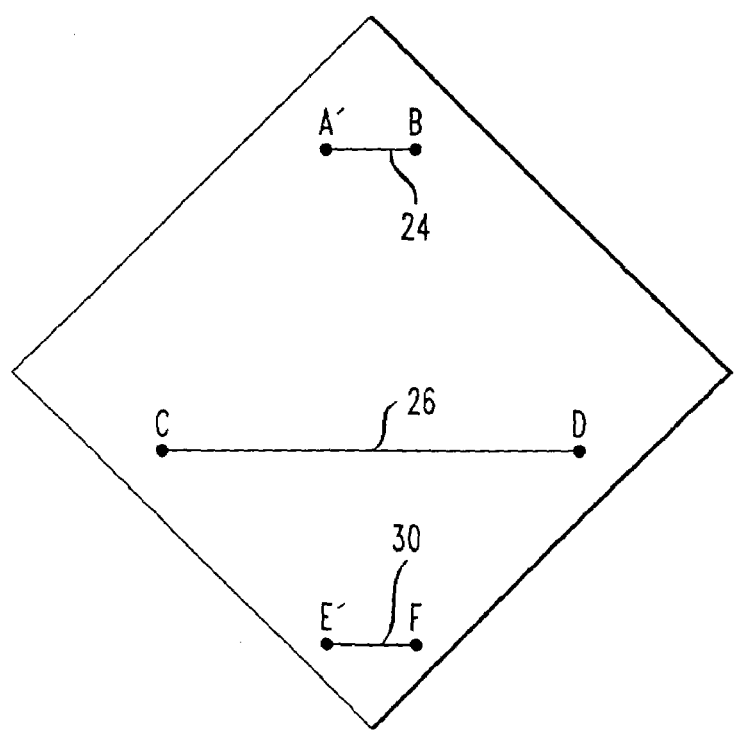
FIG. 4C is a diagram illustrating how non-horizontal/non-vertical lines are formed in accordance with an embodiment of the present invention.

An illustrative embodiment of the invention will now be explained. Instead of printing a 45° line in a Manhattan type geometry, the methodology of the present invention provides for assigning 45° lines to a particular layer of the IC being fabricated, for example, the Metal 2 layer (M2). The horizontal and vertical lines are assigned to another layer, for example, the Metal 1 layer (M1). The M2 layer therefore contains the 45° and/or 45° and 135° interconnects used in the formation of the IC. However, at the time the mask is fabricated for this particular layer, all features associated with the mask are first rotated by 45°, in either a clockwise or counter-clockwise direction, and then printed, eliminating the litho step problem as illustrated in FIG. 2. Thus, the litho step problem is eliminated by performing this rotational shift. One of ordinary skill in the art will appreciate that a CAD program tool may be developed or an existing CAD tool modified to perform this function, given the inventive teachings provided herein. Thus, the benefits of making 45° and/or 135° lines can be easily achieved without the problems described above. The CAD tool may also be used to calculate the optimum interconnect, as is known, using the Metal 1 and Metal 2 layers in order to decrease the interconnect distance. FIGS. 4A through 4C will now be used to illustrate the inventive methodology.

FIG. 4A illustrates an example of a conventional Manhattan layout. As shown, point A is connected to point B via a horizontal wire 2 and a vertical wire 4, with wire 2 and wire 4 being at right angles to one another. Similarly, point C is connected to point D via a horizontal wire 6 and a vertical wire 8, with wire 6 and wire 8 being at right angles to one another. Lastly, point E is connected to point F via a vertical wire 10 and a horizontal wire 12, with wire 10 and wire 12 being at right angles to one another.

Turning now to FIG. 4B, an illustration shows how the interconnect of FIG. 4A may be broken into a 0°/90° and 45° mask set in order to reduce interconnect distances. As shown in FIG. 4B, point A is connected to point B via a horizontal wire 22 between point A and point A' and a diagonal wire 24 between point A' and point B, with wire 22 and wire 24 being connected at an angle θ=45°. Point C is connected to point D via a diagonal wire 26 running parallel to wire A'B. Point E is connected to point F via a vertical wire 28 between point E and point E' and a diagonal wire 30 between point E' and point F, with wire 28 and wire 30 being connected at an angle θ=45°. That is, the diagonal wire E'F runs parallel to wire A'B and wire CD.

In a preferred implementation, the Metal 1 or M1 layer (not shown) routes wires oriented at 0°, i.e., wire 22, and 90°, i.e., wire 28, while the Metal 2 or M2 layer shown in FIG. 4C routes the wires oriented at 45°, i.e., 24, 26 and 30. Note that M1–M2 vias are placed at the appropriate points.

In accordance with the invention, the litho step problem illustrated in FIG. 2 is thus eliminated in the generation of A'B, CD and E'F lines shown in FIG. 4B. More particularly, FIG. 4C illustrates how the lines A'B, CD and E'F are generated according to the invention. Since the 45° lines, denoted as wires 24, 26 and 30, are designed to be formed on a separate layer from the horizontal and vertical lines, denoted as wires 22 and 28, the 45° lines associated with that separate layer are rotated or shifted 45° so that the lines appear to be of the conventional Manhattan geometry, i.e., horizontal or at 0° orientation. Such a 45° rotation is illustrated in FIG. 4C. Wires 24, 26 and 30, which are actually 45° lines in FIG. 4B, appear to be horizontal or 0° lines in FIG. 4C, after the rotation. The mask for that layer is then printed. It is to be understood that a CAD program can accomplish the rotation. Now the 45° lines can be printed without the litho step problem since they are treated as conventional Manhattan lines when it comes to forming them in an E-beam machine or any other conventional processing equipment. Of course, a 135° rotation may be used so that the lines appear to be vertical or at a 90° orientation, i.e., also in accordance with conventional Manhattan geometry.

Referring now to FIGS. 5, 6A–6C, 7A–7C and 8, a more detailed example of the conventional fabrication technique and the inventive fabrication technique will be explained in order to illustrate the many advantages realized by the invention. Particularly, a description summarizing a methodology for use in fabricating an IC in a conventional manner will be given in the context of FIGS. 6A–6C, followed by a description summarizing an illustrative methodology for use in fabricating an IC according to an embodiment of the present invention given in the context of FIGS. 7A–7C and 8.

A cross section (side view) of a portion of a chip is shown in FIG. 5. Note that the M2 layer is routed to the M1 layer using a via 52 and the same M1 is routed back to M2 using a second via 54. Area 56 represents the silicon substrate.

To fabricate this chip in a conventional manner, the masks shown in FIGS. 6A–6C may be used. It is to be understood that the masks shown in FIGS. 6A–6C are top views with the cross section view of the chip shown in FIG. 5 being taken in the direction of the arrow labeled A. The masks include respective glass substrates (60, 61 and 63) and the respective metal, e.g., cromium, interconnect portions or wires (52, 54, 62, 64 and 66) formed in accordance with the IC design layout. The actual processing of the M1 layer is well-known in the art and will not be described here. However, the mask shown in FIG. 6A is used to pattern the M1 layer of this chip into the hatch pattern 62 as shown. The chip is then coated with $SiO_2$ and the via mask shown in FIG. 6B is used to drill holes in the $SiO_2$. These holes meet up with the M1 layer. The chip is then covered with metal, where the metal also fills up the holes. The third mask shown in FIG. 6C is used to pattern the M2 layer into the hatch patterns 64 and 66. After processing, the cross-section view of these metal layers is obtained as illustrated in FIG. 5.

To achieve the same end-result connectivity as with the masks of FIGS. 6A through 6C but, in accordance with the invention, doing so while at the same time reducing wire lengths by employing non-horizontal/non-vertical wires and eliminating the litho step problem, the mask layers illustrated in FIGS. 7A–7C may be fabricated and used. That is, the same ultimate connectivity is achieved by employing a diagonal wire on the M1 layer between the two vias to connect the two metal portions of the M2 layer. The masks shown in FIGS. 7A–7C include respective glass substrates (70, 71 and 73) and the respective metal, e.g., cromium, interconnect portions or wires (72, 74, 76, 78 and 79) formed in accordance with the IC design layout and as explained below.

As previously explained in accordance with the invention, when these masks are made, the lines must be either horizontal or vertical, otherwise the litho step problem will occur. This is achieved in the following manner. First, it is to be understood that the M2 layer is fabricated with a mask as shown in FIG. 7C which is identical to the M2 mask shown in FIG. 6C. Thus, the mask shown in FIG. 7C is used to form the M2 layer into the horizontal hatch patterns 78 and 79.

Since a diagonal wire will ultimately be formed on M1 to connect the wires on M2, the distance D between the vias 74 and 76 of the via mask shown in FIG. 7B, which function similarly to vias 52 and 54 in FIG. 5 to connect the M1 and M2 layers, is measured and used to dictate the length of the diagonal interconnect section to be formed on the M1 layer. Note that the two vias in FIG. 7B are oriented at θ degrees with respect to one another and, thus, so too will the diagonal interconnect section be oriented. However, in accordance with the invention, the diagonal interconnect section that is to connect vias 74 and 76 is rotated at an angle of θ degrees before printing the mask, making the diagonal line used to connect wires 78 and 79 appear horizontal. This horizontally re-oriented section of metal 72 of length D in the M1 mask is shown in FIG. 7A. Now, when the M1 mask is printed, it is done so with only Manhattan geometry lines. Of course, as mentioned earlier, when we go to pattern M1 on the chip itself using the mask shown in FIG. 7A, the mask must be rotated back θ degrees before the M1 layer is patterned. That is, as shown in FIG. 8, the M1 mask is rotated back θ degrees, i.e., returned to the same orientation as the vias 74 and 76, before this portion of the silicon chip is patterned.

Advantageously, the total interconnect distance associated with M1 has been reduced as compared to the mask of FIG. 6A. It is to be appreciated that the diagonal line 72 may alternatively be rotated at an angle of θ degrees in the opposite direction, i.e., to make the diagonal line used to connect wires 78 and 79 appear vertical, rather than horizontal, thus also avoiding the litho step problem.

Also, note that as the number of metal levels continues to increase, e.g., greater than 6 or 8, the allowable rotations can be divided equally around 180°, e.g., $$\frac{180°}{6} = 30°,$$

or more generally $$\frac{180°}{N},$$

where N equals the number of metal layers. We also only have to divide this around 180°, not 360°, since θ=90° is the same as θ=270°. However, from an isolation standpoint, $$\frac{360°}{N}$$

is fine.

Figure 9:
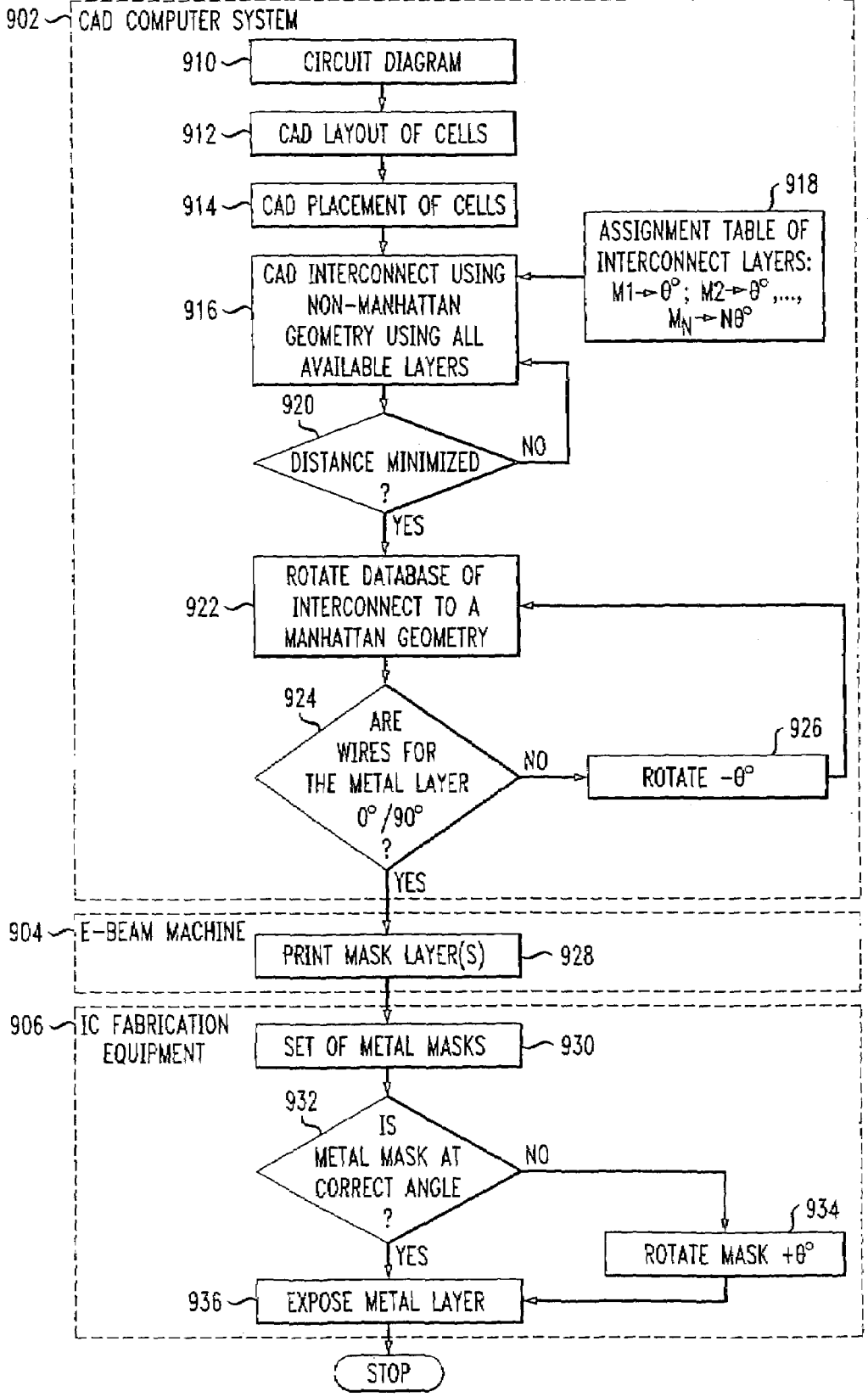
FIG. 9 is a block diagram illustrating an exemplary hardware implementation of an IC fabrication system within which the present invention may be employed.

FIG. 9 is a block diagram illustrating an exemplary hardware implementation of an IC fabrication system within which the present invention may be employed. As shown, the IC fabrication system 900 includes a CAD computer system 902, an E-beam machine 904 and IC fabrication equipment 906.

The CAD computer system 902 may be any type of computing device, e.g., personal computer, mainframe, etc., comprising at least a processor, memory and I/O devices for executing the CAD functions and various methodologies described herein. It is to be appreciated that the term "processor" as used herein is intended to include any processing device, such as, for example, one that includes a central processing unit, CPU, and/or other processing circuitry. The term "memory" as used herein is intended to include memory associated with a processor or CPU, such as, for example: RAM; ROM; a fixed memory device, e.g., hard drive; a removable memory device, e.g., diskette; flash memory; etc. In addition, the term "input/output devices" or "I/O devices" as used herein is intended to include, for example: one or more input devices, e.g., keyboard, mouse, for entering data to the processing unit; and/or one or more output devices, e.g., CRT display and/or printer, for presenting results associated with the processing unit. It is also to be understood that the term "processor" may refer to more than one processing device and that various elements associated with a processing device may be shared by other processing devices. Accordingly, software components including instructions or code for performing the functions and methodologies, as described herein, may be stored in one or more of the associated memory devices, e.g., ROM, fixed or removable memory, and when ready to be utilized, loaded in part or in whole, e.g., into RAM, and executed by a CPU.

As shown, a circuit diagram 910 whose functionality and interconnectivity is to be implemented in the IC being fabricated is input to the CAD system 902. In block 912, a CAD layout of the various cells forming the circuit is performed. Then, in block 914, the cells are placed or located at particular areas of the chip.

Next, in block 916, in accordance with an assignment table 918 of interconnect layers, e.g., M1→0°, M2→θ degrees, . . . , $M_N$→N θ degrees, the overall interconnect is designed using non-Manhattan geometry and all available layers. A determination is made in block 920 as to whether individual interconnect distances have been minimized. If not, such interconnect distances are minimized to achieve an optimum overall interconnect. Once all distances have been sufficiently minimized, blocks 922, 924 and 926 are performed such that all the non-Manhattan geometry features of the interconnect are rotated to a Manhattan geometry. That is, as explained above in detail, the non-horizontal and/or non-vertical wires are rotated such that the wires are re-oriented to a horizontal and/or vertical position. Thus, after the rotating operations, the masks representing the assigned layers include only features that are consistent with a Manhattan geometry.

Then, in accordance with the E-beam machine 904 and as is known in the art, the masks are printed in block 928. The set of metal masks 930 are then provided to the IC fabrication equipment 906 which exposes the metal layers using the masks to actually form the patterned chip such that an IC having the functionality and interconnectivity associated with the circuit diagram 910 is fabricated. However, in accordance with the invention, the metal masks which contain features which were rotated before printing must be rotated so that the features thereon are now re-oriented at the correct or intended angle, e.g., diagonal wires should be at a 45° angle. This is accomplished in accordance with blocks 932 and 934. Then, the metal layers are exposed in block 936 using the correctly oriented masks. Once all layers have been exposed, the fabrication process ends at block 938.

It is to be understood that as IC fabrication technology continues to scale down the IC size, the number of metal levels will continue to increase. Thus, in accordance with the present invention, it is possible to assign a particular orientation or angle $θ_n$, n=1, 2, . . . i, to a given level or layer n. That is, for example, layer M1 may be assigned 0° wires, layer M2 may be assigned 30° wires, layer M3 may be assigned 60° wires, layer M4 may be assigned 90° wires, and so on and so forth. The orientation of the different layers or levels can easily be accomplished by rotating the levels which are non-0° or non-90° to either 0° or 90° to form the mask level. Information containing the orientation of these mask levels is contained in the orientation marks on the mask periphery and ensures that a mask is in the correct position during exposure. Note that one could also place 30° and 120° lines on the same level. The decision whether to use orthogonal wires in the same level, or again to use only one of the two, will be based on the number of metal levels available and whether orthogonal layers can be formed in subsections without interfering with the other areas.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. An integrated circuit, at least a portion of the integrated circuit formed according to a fabrication method comprising the steps of:
    assigning one or more interconnect lines associated with the integrated circuit which are non-horizontal and non-vertical to at least one metal mask layer separate from at least another metal mask layer assigned to at least one of horizontal interconnect lines and vertical interconnect lines;
    rotating each of the one or more non-horizontal/non-vertical interconnect lines from an original orientation by a predetermined angle determined by the original line orientation so that the one or more non-horizontal/non-vertical interconnect lines are at least one of horizontally and vertically oriented;
    printing the one or more rotated non-horizontal/non-vertical interconnect lines on the at least one metal mask layer assigned thereto;
    rotating the at least one printed metal mask layer so that each of the one or more non-horizontal/non-vertical interconnect lines is returned to its original orientation; and
    using the rotated metal mask layer to expose a corresponding metal layer of the integrated circuit.

2. An integrated circuit, the integrated circuit comprising one or more metal layers, wherein at least one of the one or more metal layers includes only wires which are non-horizontally and non-vertically oriented.

3. The integrated circuit of claim 2, wherein all of the one or more metal layers include only wires which are non-horizontally and non-vertically oriented.

4. The integrated circuit of claim 2, wherein, prior to fabricating the one or more metal layers, the non-horizontal and non-vertical oriented wires are printed on one or more corresponding metal mask layers without suffering from a litho step waviness condition.

5. The integrated circuit of claim 2, wherein at least a portion of the integrated circuit is fabricated via a process comprising the following steps:
    assigning one or more wires associated with the integrated circuit which are non-horizontal and non-vertical to at least one metal mask layer separate from at least another metal mask layer assigned to at least one of horizontal wires and vertical wires;
    rotating each of the one or more non-horizontal/non-vertical wires from an original orientation by a predetermined angle determined by the original line orientation so that the one or more non-horizontal/non-vertical wires are at least one of horizontally and vertically oriented;
    printing the one or more rotated non-horizontal/non-vertical wires on the at least one metal mask layer assigned thereto;
    rotating the at least one printed metal mask layer so that each of the one or more non-horizontal/non-vertical interconnect wires is returned to its original orientation; and
    using the rotated metal mask layer to expose a corresponding metal layer of the integrated circuit.

* * * * *